United States Patent [19]

Tsuzuki et al.

[11] Patent Number: 4,896,199
[45] Date of Patent: * Jan. 23, 1990

[54] SEMICONDUCTOR DEVICE WITH PROTECTIVE MEANS AGAINST OVERHEATING

[75] Inventors: Yukio Tsuzuki, Aichi; Masami Yamaoka, Anjo, both of Japan

[73] Assignee: Nippondenso Co., Ltd., Kariya, Japan

[*] Notice: The portion of the term of this patent subsequent to Jul. 26, 2005 has been disclaimed.

[21] Appl. No.: 169,001

[22] Filed: Mar. 16, 1988

Related U.S. Application Data

[62] Division of Ser. No. 935,718, Nov. 28, 1986, Pat. No. 4,760,434.

[30] Foreign Application Priority Data

Nov. 29, 1985 [JP] Japan .................................. 60-270141

[51] Int. Cl.$^4$ ............................................. H01L 23/56
[52] U.S. Cl. ......................................... 357/28; 357/59; 357/51; 357/23.4; 357/23.1; 307/310
[58] Field of Search .................... 357/23.4, 23.1, 28, 357/41, 49, 51, 59 G; 307/310

[56] References Cited

U.S. PATENT DOCUMENTS

| | | | |
|---|---|---|---|
| 4,198,581 | 4/1980 | Ahmed | 307/310 |
| 4,374,316 | 2/1983 | Inamori et al. | 357/28 X |
| 4,456,919 | 6/1984 | Tomita et al. | 357/28 |
| 4,492,974 | 1/1985 | Yoshida et al. | 357/41 X |
| 4,780,434 | 7/1988 | Tsuzuki et al. | 357/23.8 X |

FOREIGN PATENT DOCUMENTS

| | | | |
|---|---|---|---|
| 0075833 | 4/1983 | European Pat. Off. | 357/28 X |
| 52-72183 | 6/1977 | Japan | 357/28 |
| 57-145355 | 9/1982 | Japan | 357/28 |
| 58-138074 | 8/1983 | Japan | 357/23.13 X |
| 59-224172 | 12/1984 | Japan | 357/43 X |

OTHER PUBLICATIONS

Wrathall, "The Design of a High Power Solid State Automotive Switch in CMOS–VDMOS Technology," IEEE Power Electronics Specialists' Conference, Jun. 1985, pp. 229–233.

"Self–Thermal Protecting Power MOSFET's"; Y. Tsuzuki, M. Yamaoka, et al, Nippondenso Co., Ltd., Japan, Eighteenth Annual Power Electronics Specialists Conference, Jun. 21–26, 1987.

Primary Examiner—William Mintel
Attorney, Agent, or Firm—Cushman, Darby & Cushman

[57] ABSTRACT

A semiconductor substrate has a power region and a control region. The control region is located in the center portion of the substrate, and the power region surrounds the control region and is separated therefrom. A vertical type, MOS transistor, i.e., an active semiconductor element, is formed on the power region. An insulation film is formed on part of the control region. A polycrystalline silicon diode, which functions as a heat-sensitive element, is formed on the insulation film. A control section comprising a lateral type, MOS transistor is also formed on the control region. The lateral type, MOS transistor is connected to receive a signal form the polycrystalline silicon diode. Further, a polycrystalline silicon resistor, which determines a circuit constant, is formed on the insulation film. The MOS transistor protects the active semiconductor element in response to a signal supplied from the heat-sensitive element showing that the temperature of the semiconductor substrate has risen above a predetermined value. For example, the active semiconductor element may be disabled until the detected temperature drops below a predetermined value.

7 Claims, 7 Drawing Sheets

F I G. 8
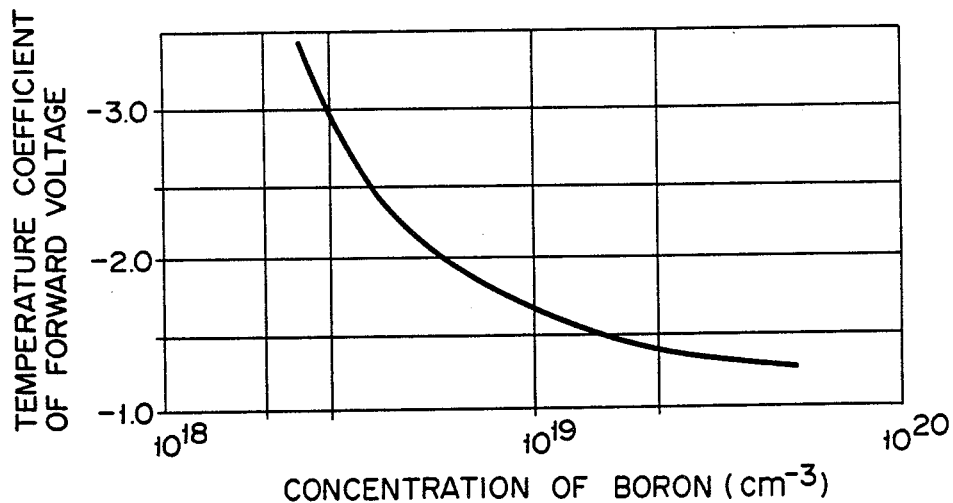
F I G. 9
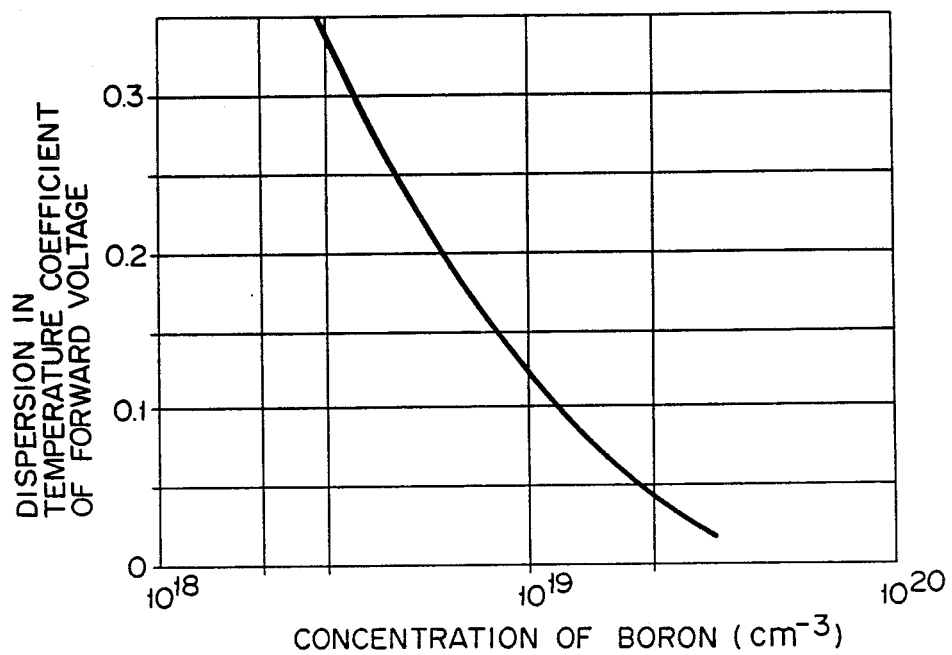

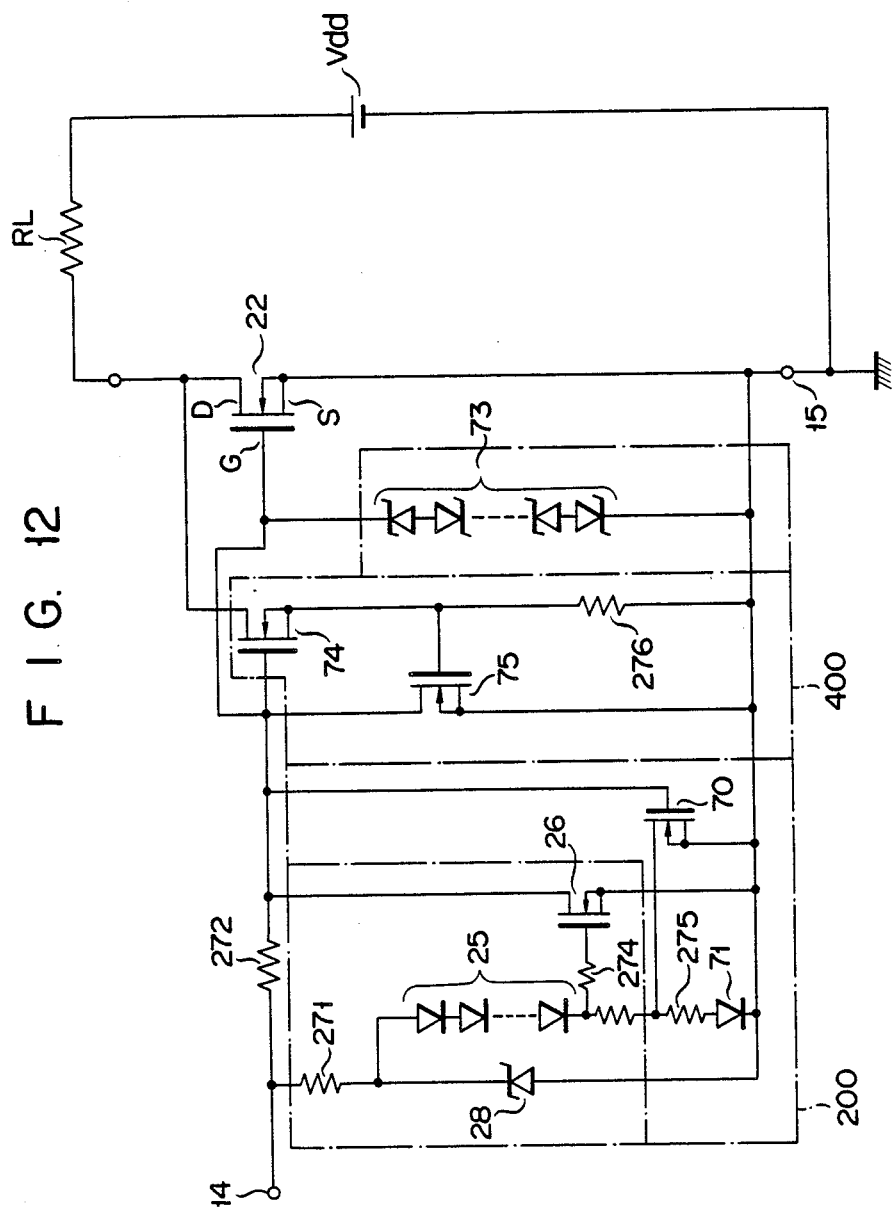
F I G. 12

«4,896,199»

SEMICONDUCTOR DEVICE WITH PROTECTIVE MEANS AGAINST OVERHEATING

BACKGROUND OF THE INVENTION

This is a division of application Ser. No. 935,718, filed Nov. 28, 1986, issued on July 26, 1988 as U.S. Pat. No. 4,760,434.

The present invention relates to a semiconductor device with protective means against overheating, and more particularly to a semiconductor device which has means for protecting the circuit section of the device from overheating due to the excessive temperature rise of the semiconductor elements provided within the circuit section.

In a semiconductor device comprising a circuit section having active elements, the junctions of these elements generate heat as the device operates. When the temperature of the junctions rises above a particular value, the circuit section will be broken down. A semiconductor device is known which is designed to protect itself from overheating. In this device, a heat-sensitive element such as a heat-sensing transistor is formed on a semiconductor substrate, along with the active elements, and the output signals of the heat-sensitive element control the active elements.

In the semiconductor device, the active elements and the heat-sensitive element are formed on the same semiconductor substrate. It is therefore difficult to trim the substrate after forming these elements, such that the elements can have design precision. Also, since the heat-sensitive elements are not electrically insulated from that portion of the substrate which surrounds the heat-sensitive element, parasitic actions will occur inevitably between the active elements.

SUMMARY OF THE INVENTION

It is an object of the present invention to provide a semiconductor device which has a circuit section and means which can effectively detect an excessive temperature rise of the active elements provided in the circuit section and can protect the circuit section from overheating due to an excessive temperature rise of the active elements.

Another object of the invention is to provide a semiconductor device comprising a heat-sensitive element for detecting an excessive temperature rise of the active elements. The heat-sensitive element is electrically insulated from the active elements. Due to this electrical insulation, the active elements and the heat-sensitive element can stably operate.

Another object of this invention is to provide a semiconductor device comprising a semiconductor substrate, a circuit section including active elements formed on the substrate, and a heat-detecting section including heat-sensitive elements formed on the semiconductor substrate for detecting a temperature rise of the substrate, wherein the circuit section can be reliably protected from overheating.

Still another object of the invention is to provide a semiconductor device comprising a semiconductor substrate, and a heat-detecting section formed on the substrate and composed of PN junctions of polycrystalline silicon, whereby the device can withstand a high voltage and a stable temperature characteristic, and thus can be reliably protected from overheating.

According to the present invention, there is provided a semiconductor device comprising a semiconductor substrate, a semiconductor circuit formed on the substrate and including active elements, an insulation film formed on at least one portion of the substrate, a heat-sensing element formed on the insulation film for measuring the temperature of that portion of the substrate, and a control section for controlling the semiconductor circuit in accordance with an output signal from the heat-sensitive element, thereby protecting the circuit from overheating.

As long as the junctions of the active elements undergo no excessive temperature rises, and the substrate is not excessively heated, the control section does not control the semiconductor circuit to protect the same from overheating. When the heat-sensitive element detects that the temperature of the substrate rises above a predetermined value, however, it generates an output outputted signal. The signal causes the control section to protect the circuit from overheating. More precisely, the control section forcibly stops the semiconductor circuit, thereby preventing the active elements from being broken down by the heat generated at their junctions.

As has been stated, an insulation film is formed on the semiconductor substrate. This film electrically insulates or separates the heat-sensitive element from the substrate. Therefore, not only can the film reliably prevent parasitic actions between the active elements, but it also makes it possible to trim the semiconductor substrate and the heat-sensitive element, independently of each other.

BRIEF DESCRIPTION OF THE DRAWINGS

FIGS. 6 to 9 are graphs representing the characteristics of the polycrystalline silicon diodes used in the device of FIG. 1;

FIG. 12 is a circuit diagram of a further control section which can be used in the device of FIG. 1.

DETAILED DESCRIPTION OF THE PREFERRED EMBODIMENTS

Figure 1:
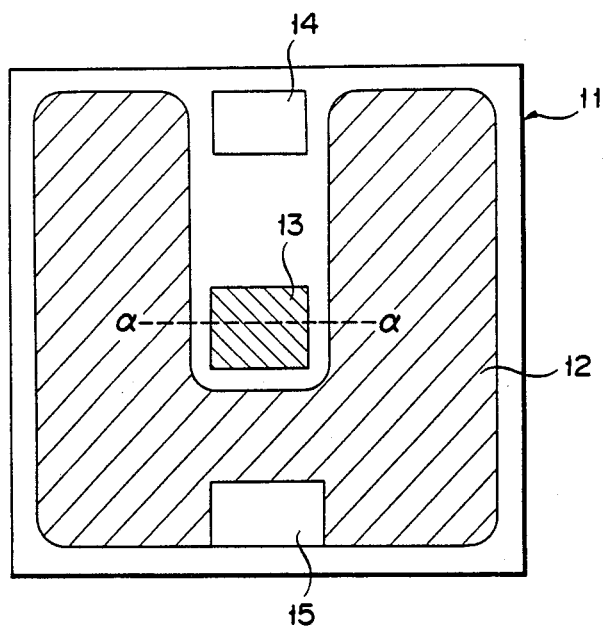
FIG. 1 is a plan view of a semiconductor device according to one embodiment of the present invention, showing the positions of the various regions of the device.

FIG. 1 is a schematical plan view of a semiconductor d(R)vice aCCOrding to the invention, which has means for protecting the device from overheating. As shown in FIG. 1, the device comprises semiconductor substrate 11. The greater part of substrate 11 is power region 12. A semiconductor circuit including active elements is formed in power region 12. The center portion of substrate 11, which has a low heat-radiation efficiency and can easily be heated to a high temperature, is control region 13 which functions to detect temperature. Bonding pads 14 and 15 also are formed on semiconductor substrate 11. Pad 14 is used to draw the gate electrodes of the active elements, and pad 15 is used to draw the source electrodes of the active elements.

Figure 2:
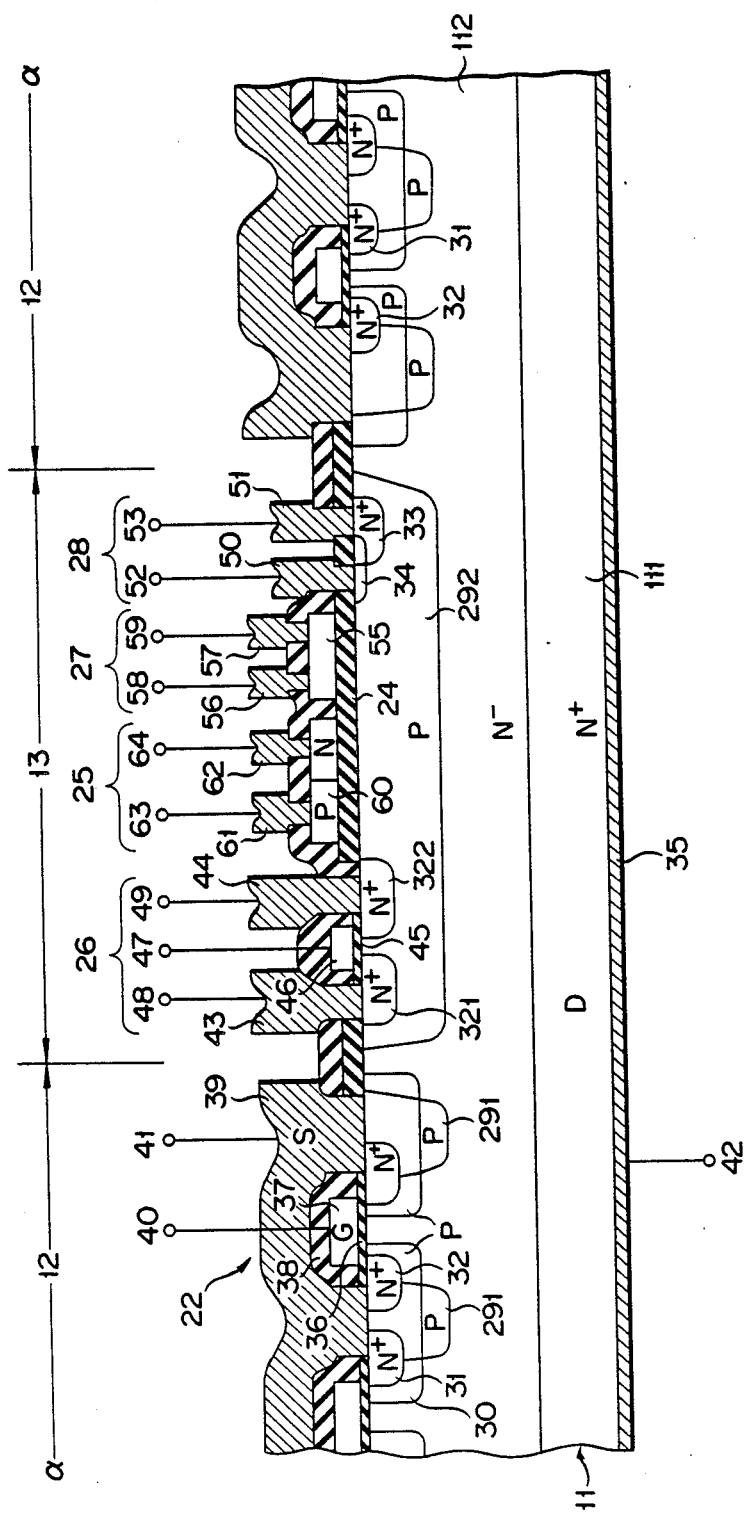
FIG. 2 is a cross-sectional view of the device, taken along line α—α in FIG. 1.

FIG. 2 is a cross-sectional view of the semiconductor device of FIG. 1, taken along line α—α. Particularly, the figure shows control region 13 and that portion of power region 12 which surrounds region 13. As is shown in FIG. 2, a vertical type power MOS transistor (an active element) 22 is formed in power region 12. Other power MOS transistors (not shown) are formed in power region 12 as well. MOS transistor 22 and other power MOS transistors (not shown) are arranged in rows and columns, and are connected in parallel, thereby forming a semiconductor circuit of multi-source structure.

Insulation film 24 is formed on control region 3. A plurality of polycrystalline silicon diodes 25 are formed on insulation film 24. Diodes 25 are connected in series, thus forming a heat-sensitive element. Lateral type MOS transistor 26, polycrystalline silicon resistor 27 and constant-voltage zener diode 28 are also provided around diode 25. Transistor 26, resistor 27 and zener diode 28 form a control section.

The structure of the semiconductor device will be described in greater detail, with reference to FIG. 2. Semiconductor substrate 11 is an N+type silicon substrate 111. N-type silicon epitaxial layer 112 is formed on the substrate 111. Deep P type diffusion layer 291 is formed in that portion of epitaxial layer 112 which corresponds to power region 12. P type diffusion layer 292, which corresponds to control region 13, is formed in a similar manner. Further, shallow P type layer 30, which corresponds to P type diffusion layer 291, is formed. Further, N+type diffusion layer 31, which corresponds to vertical type MOS transistor 22, is formed. N+type diffusion layers 321 and 322, which correspond to lateral type MOS transistor 26, are formed. N+type diffusion layer 33, which corresponds to constant-voltage zener diode 28, is formed. Further, P+type diffusion layer 34 is formed.

Power MOS transistor 22 comprises silicon epitaxial layer 112, silicon substrate 111, and drain D made of drain electrode 35. Gate G of transistor 22 is formed of polycrystalline silicon layer 37 formed on gate oxide film 36. Source S of transistor 22 is made of aluminum electrode 39 covering inter-layer insulation film 38 which in turn covers up polycrystalline silicon layer 37.

When gate voltage is applied to gate G from terminal 40 through bonding pad 14, a channel is formed between silicon epitaxial layer 112 and N+type diffusion layers 31 and 32. As a result, a current flows between source S and drain D, more precisely between terminals 41 and 42.

As has been described, P type diffusion layer 291 is formed partly in P type diffusion layer 30, and is deeper than layer 30. Hence, power MOS transistor 22 can be protected against an excessively high voltage. P type diffusion layers 30 and 291 having this specific positional relation determine the breakdown voltage of MOS transistor 22.

Lateral type MOS transistor 26 has a source formed of N+type diffusion layer 321 and aluminum electrode 43, a drain made of N+type diffusion layer 322 aluminum electrode 44, and a gate made of polycrystalline silicon layer 46. Silicon layer 46 is formed on gate oxide film 45 which in turn is formed partly on layers 321 and 322 and partly on P type diffusion layer 292. When a gate voltage is applied to the gate from terminal 47, an N channel is formed among polycrystalline silicon layer 46 and N+type diffusion layers 321 and 322. As a result, a current flows between terminal 48 (source) and terminal 49 (drain).

Constant-voltage zener diode 28 comprises diffusion layers 33 and 34. Aluminum electrodes 50 and 51 contact layers 34 and 33, respectively. Electrodes 10 and 51 are connected to terminals 52 and 53.

Insulation film 24 of, for example, $SiO_2$ is formed by thermal oxidation on diffusion layer 292 occupying control region 13. Polycrystalline silicon resistor 27 and polycrystalline silicon diode 25 having a PN junction are formed on insulation film 24. Resistor 27 is made of polycrystalline silicon layer 55. Aluminum electrodes 56 and 57 contact layer 55 and are connected to terminals 58 and 59. Diode 25 is formed by diffusing a prescribed impurity into polycrystalline silicon layer 60, thereby forming a PN junction. Aluminum electrode 61 is formed on the P type portion of layer 60, and aluminum electrode 62 is formed on the N type portion of layer 60. Electrodes 61 and 62 are connected to terminals 63 and 64, respectively.

Figure 3:
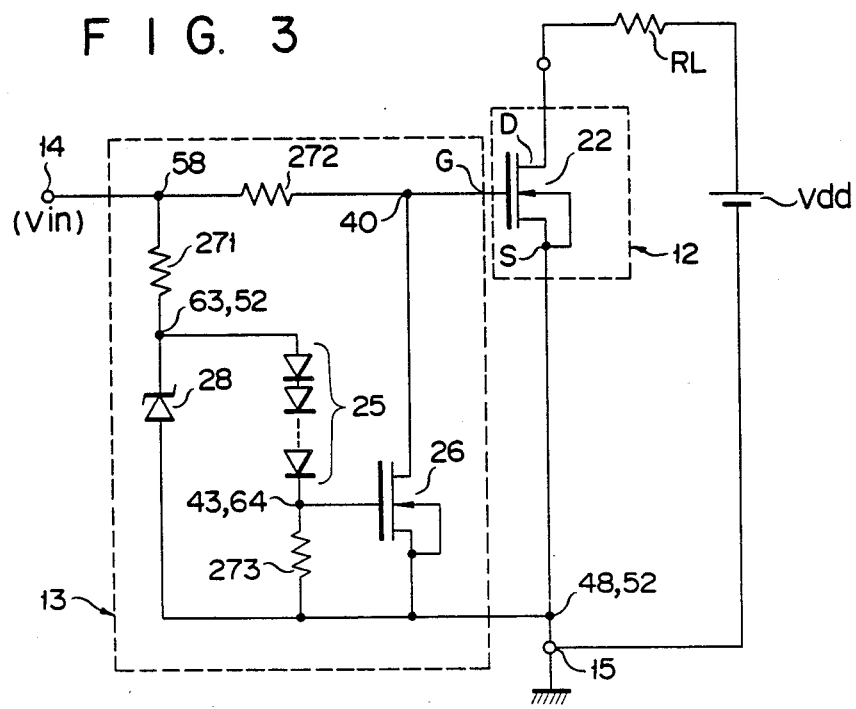
FIG. 3 is an equivalent circuit diagram of the control section provided within the semiconductor device.

FIG. 3 is an equivalent circuit diagram showing the semiconductor device of FIG. 2. In this figure, the same numerals are used to designate the same components as shown in FIGS. 1 and 2, except that numerals 271 to 273 denote polycrystalline silicon resistors, $R_L$ represents a load resistor connected to an external device, and Vdd denotes an external power source.

When the temperature of silicon substrate 111 is below a predetermined value, that is, when the junction of power MOS transistor 22 is at normal temperature, transistor 22 is turned on by input voltage Vin. When the temperature of silicon substrate 111 rises above the predetermined value, that is, when the junction of power MOS transistor 22 is at excessively high temperature, however, the forward voltage of polycrystalline silicon diode 25, which functions as a heat-sensitive element, lowers. Diode 25 has a particular negative temperature coefficient. Hence, the more it is heated, the more its forward voltage falls. When the forward voltage of diode 25 lowers, resistor 273 raises the gate-source voltage of lateral MOS transistor 26.

When its gate-source voltage rises, MOS transistor 26 is turned on. If resistor 272 has a resistance much higher than the resistance which MOS transistor 26 has while transistor 26 is on, the potential at point 40 where the drain electrode of transistor 26 is located, and where gate G of power MOS transistor 22 is coupled, will abruptly fail when the temperature of substrate 111 rises above the predetermined value.

Figure 4:
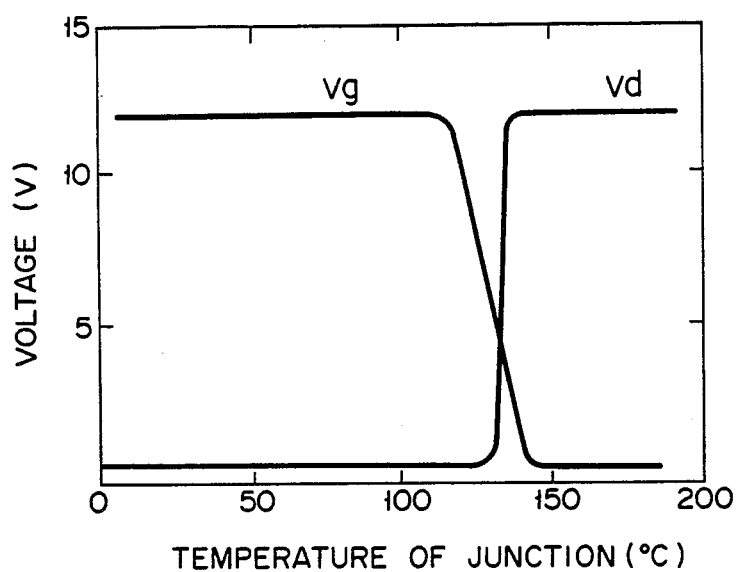
FIG. 4 is a graph illustrating the relationship between the temperature of the junction of a power MOS transistor and the gate voltage of the transistor, and also the relationship between the temperature and the drain voltage of the transistor.

FIG. 4 shows the relationship between the gate voltage Vg and drain voltage Vd of power MOS transistor 22, on the one hand, and the temperature of the junction of this MOS transistor on the other. When the temperature of the junction rises to 130° C. or thereabouts, transistor 26 is turned on thereby quickly reducing gate voltage Vg to zero volt to protect power MOS transistor 22. To be precise, when this temperature rises to about 130° C., transistor 22 is forcibly turned off, thereby protecting the elements from breakdown.

As has been stated, polycrystalline silicon diode 25 (i.e., the heat-sensing element) and silicon resistor 27 are provided on insulation film 24 formed on control region 13. This structural feature makes it easy to trim these elements independently. Further, due to this feature, no parasitic actions occur between these elements. Moreover, since polycrystalline silicon diode 25, which functions as a heat-sensitive element, is located in control region 13, i.e., the center portion of substrate 11, it can accurately measure the temperature rise of substrate 11 resulting from a junction temperature rise of power MOS transistor 22, and can therefore ensure a reliable protection of the elements from breakdown.

The elements on insulation film 24 can be made in the same steps as power MOS transistor 22 In other words, no additional steps need to be carried out to manufacture these elements. Polycrystalline silicon resistor also 27 can be trimmed. Hence, its resistance can be accurately adjusted to any reference temperature selected, after the semiconductor device has been manufactured. Alternatively, the reference temperature can be set to any desired value by forming a required number of PN junctions in polycrystalline silicon diode 27.

Figure 5:
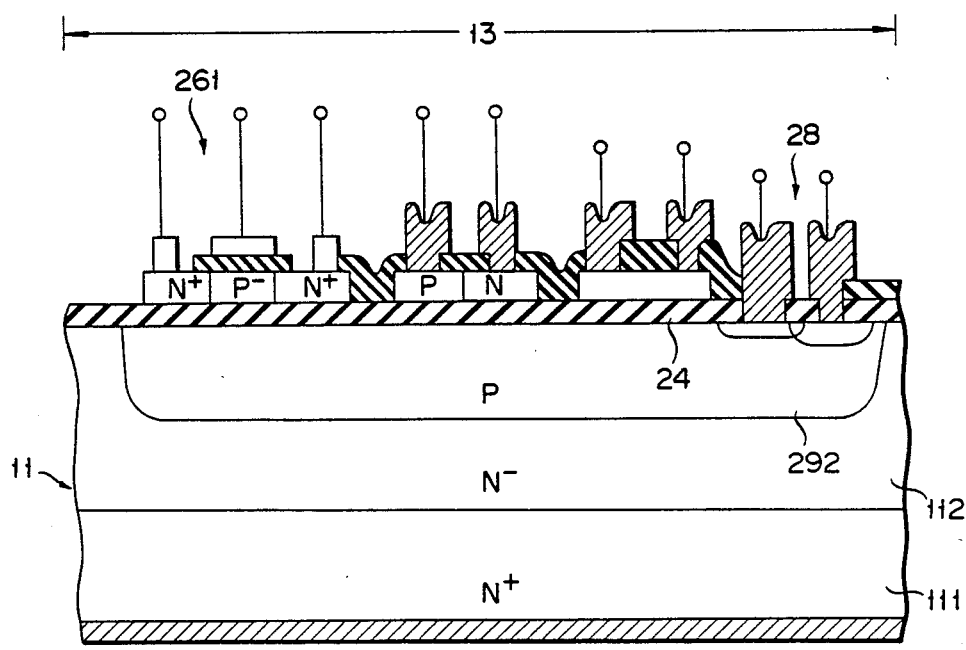
FIG. 5 is a cross-sectional view of another control section which can be provided in the device of FIG. 1.

In the above embodiment, silicon diode 25 and silicon resistor 27, both formed in control region 13, are formed on insulation film 24. All the other elements can also be formed on insulation film 24. As is shown in FIG. 5, for example, it is possible to form lateral MOS transistor 261 on insulation film 24 and constant-voltage zener diode 28 directly on diffusion layer 292. Alternatively, lateral transistor 261 can be formed on diffusion layer 292, and zener diode 28 can be formed on insulation film 24.

In the above embodiment, MOS transistors 22 and 26 have an N channel. Needless to say, they can be so formed as to have a P channel. The semiconductor device of this embodiment has an active element, that is, a power MOS transistor. This MOS transistor can be replaced by a bipolar transistor or a power IC. Further, polycrystalline silicon diode 25, which functions as the heat-sensitive element, can be replaced by a thermistor of the ordinary type. Moreover, the polycrystalline silicon resistors can be replaced by resistors made of tantalum nitride.

Generally, it is difficult to manufacture diodes having a design breakdown characteristic or a design temperature characteristics when the diodes are made of polycrystalline silicon formed by depositing silicon. The polycrystalline silicon diode used in the present invention has both a design breakdown characteristic and a design temperature characteristic. It comprises a P type region and an N type region which form a PN junction. Furthermore, the low impurity-concentration portions of the N type and P type regions have impurity concentrations of $1 \times 10^{19} cm^{-3}$ or more.

In the polycrystalline silicon diode, that region of a silicon island, which will become an N type region, is doped with phosphorus, an N type impurity, and that region, which will become a P type region, is doped with boron, a P type impurity. The concentration of boron influences very much the breakdown characteristic and temperature characteristic of the diode. The concentration of boron is selected to be $1 \times 10^{19} cm^{-3}$, thus imparting the desired breakdown characteristic and temperature characteristic to the diode. Hence, the diode is greatly reliable.

With reference to FIG. 2, the process of forming polycrystalline diode 25 will be briefly explained.

First, a polycrystalline silicon film having a thickness of about 2000 Å to about 5000 Å is formed by the CVD method on insulation film 24 which has been formed by thermal oxidation of silicon substrate 11. The silicon film is then patterned by plasma etching. Phosphorus ions are injected into the patterned polycrystalline silicon film, thereby forming an N type region. Further, boron ions are injected into that portion of the silicon film which surrounds the N type region, thus forming a P type region. Thereafter, the unfinished product is heated, thus activating the phosphorus and boron ions. An inter-layer insulation film of oxide silicon or the like is then formed by the CVD method on the upper surface of the unfinished product.

The polycrystalline silicon used for forming the diode of the structure described above is made up of countless crystals. Trap levels exist at the interfaces among these crystals. Carriers are therefore trapped in the trap level, inevitably building up a barrier potential.

This barrier potential largely depends on the quality of the polycrystalline silicon film. It will ultimately much influence the characteristics of the polycrystalline silicon diode. More specifically, the value of barrier potential is determined by the amount of the impurity contained in the polycrystalline silicon. The greater the content of the impurity, the lower the barrier potential. Therefore, the low impurity-concentration portions of the N and P type regions forming the polycrystalline silicon diode must have a relatively high impurity concentration in order to stabilize the characteristics of the diode.

Figure 6:
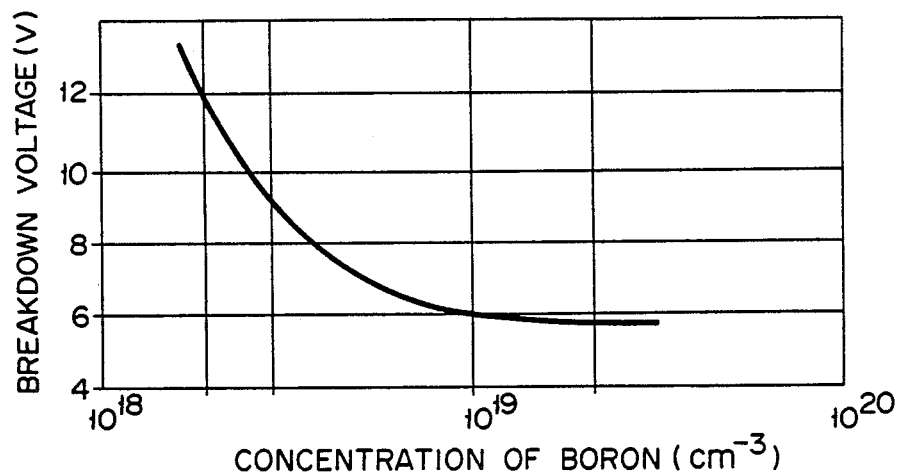
Figure 7:
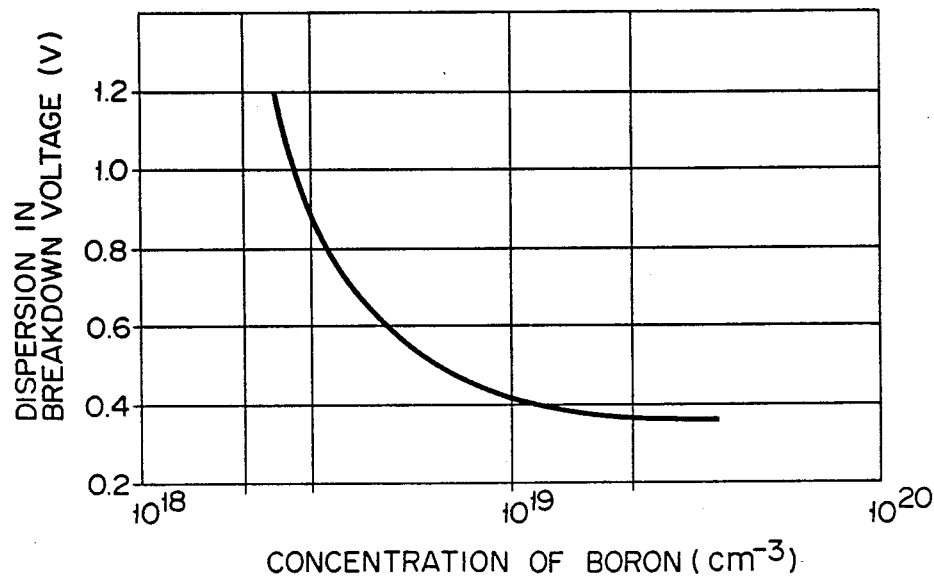

FIG. 6 represents the relationship between the boron concentration of the P type region of the diode and the breakdown voltage of the diode. FIG. 7 shows the relationship between this boron concentration and the difference in breakdown voltage among the diodes. FIG. 8 illustrates the relationship between the boron concentration and the temperature coefficient of forward voltage. FIG. 9 shows the relationship between the boron concentration and the difference in temperature coefficient among the diodes.

As is shown in FIGS. 7 and 9, when the P type region has a boron concentration of $1 \times 10^{19} cm^{-3}$ or more, the difference of breakdown voltage and the difference of the temperature coefficient sharply decrease. Polycrystalline silicon diode 25, whose P type region has a boron concentration of $1 \times 10^{19} cm^{-3}$, has both a design withstand voltage and a design temperature characteristic.

Instead of controlling the boron concentration of the P type region of diode 25, the concentration of an N type impurity (e.g., phosphorus or arsenic) can be controlled for the purpose of imparting design withstand voltage and temperature characteristics to the diode. In this case, too, the concentration of the N type impurity is set to be $1 \times 10^{19} cm^{-3}$.

Figure 10:
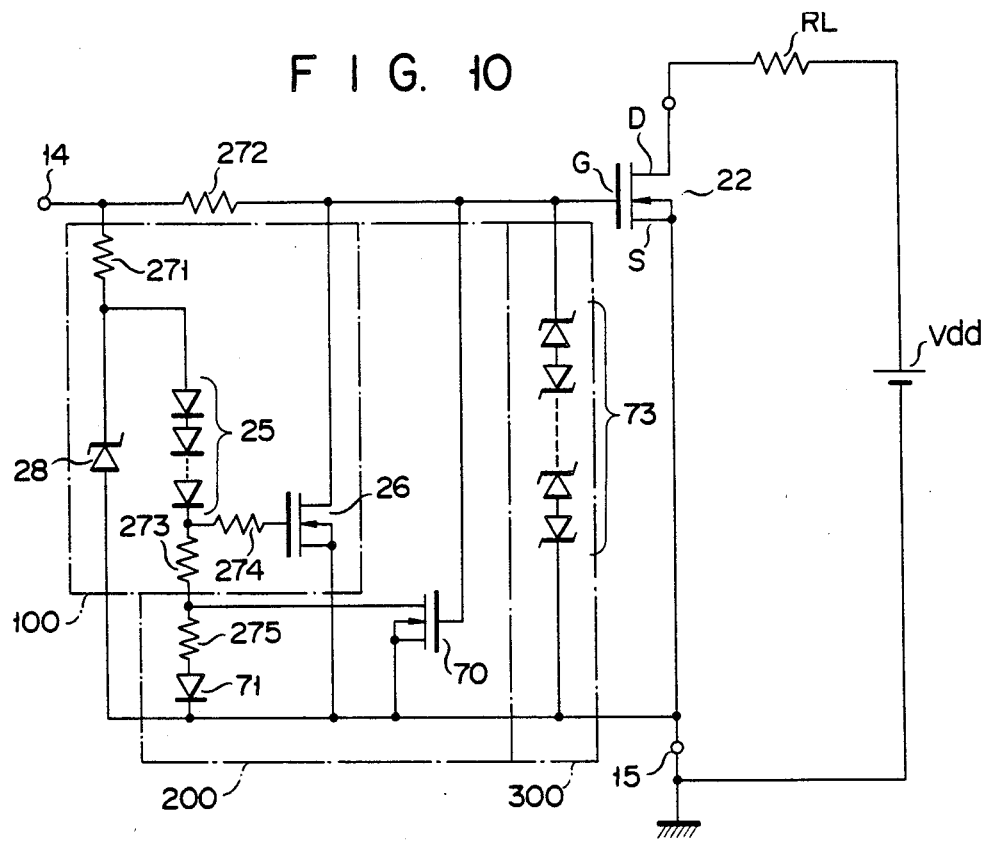
FIG. 10 is a circuit diagram of still another control section.

FIG. 10 shows another control section which is formed in control region 13. This control section comprises unit 100 for protecting the device against an excessive temperature rise, hysteresis unit 200 and gate-protecting unit 300. Unit 100 is similar to the protective unit shown in FIG. 3.

To fabricate the control section of FIG. 10, polycrystalline silicon diode 25, lateral type MOS transistor 26, polycrystalline silicon resistor 27 (271-275), constant-voltage zener diode 28, and the like are formed on control region 13, i.e., the center portion of semiconductor substrate 11, side by side in the same plane as is illustrated in FIG. 1. Polycrystalline silicon diode 25, or a heat-sensitive element, is thus composed of a plurality of silicon islands. The silicon islands form the PN junctions of series-connected diode elements.

Hysteresis unit 200 comprises MOS transistor 70, diode 71, etc. which are formed in control region 13. MOS transistor 70 is a lateral type transistor. Unit 300 also comprises a number of diodes 73 which are formed either within or without control region 13.

Figure 11:
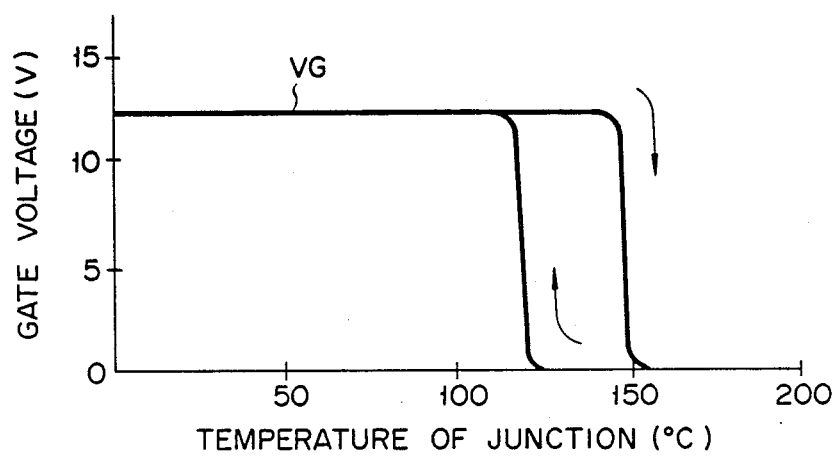
FIG. 11 is a graph showing the relationship between the gate voltage of the MOS transistor used in the control section of FIG. 10 and the temperature of the junction of the MOS transistor.

The control section of FIG. 10 is advantageous over the control section of FIG. 3 in the following respect. In the section shown in FIG. 3, the drain of power MOS transistor 22 may oscillate when it is heated to the reference temperature or thereabouts. In the control section of FIG. 10, hysteresis unit 200 gives hysteresis to the operating point of control MOS transistor 26, thereby preventing the drain of power MOS transistor from oscillating. Hence, lateral type MOS transistor 70, resistor 275 and level-shifting diode 71 cooperate to vary the potential at the point corresponding to the gate of lateral type MOS transistor 26. Gate voltage Vg of power MOS transistor 22 can thereby have such hysteresis as is illustrated in FIG. 11.

The operation of the control section shown in FIG. 10 now will be described in detail.

As long as the temperature of silicon substrate 111 remains below the reference value, power MOS transistor 22 is on due to input voltage Vin, and MOS transistor 70 is also on. The resistance which MOS transistor 70 has in this condition is negligibly small in comparison with the resistance of resistor 275. Therefore, the gate voltage of MOS transistor 26 is determined by the resistance of resistor 273 and the current flowing through resistor 273.

When the temperature of silicon substrate 111 rises above the reference value, the forward voltage of polycrystalline silicon diode 25 (i.e., the heat-sensitive element) falls. As a result, the voltage between the ends of resistor 273 proportionately rises. When this voltage exceeds a predetermined value, MOS transistor 26 is turned on. More specifically, MOS transistor 26 is turned on when its junction temperature rises to 150° C. or thereabouts. Therefore, the gate voltage Vg of power MOS transistor 22 falls, and transistor 22 is turned off. Also, lateral type MOS transistor 70 is turned off. While power MOS transistor 22 is off, resistor 275 and diode 71 are connected in series to resistor 273. The resistance of this portion therefore increases. As a result, the voltage applied to the gate of MOS transistor 26 rises, and the operation temperature falls a little (to 120° C.) as shown in FIG. 11. Consequently, the voltage drop in group of diodes 25 increases, whereby MOS transistor 26 is turned off. That is, sufficient hysteresis is provided, and the oscillation of power MOS transistor 22 is prevented. In other words, power MOS transistor 22 has such hysteresis that it is turned off when its junction temperature rises above 150° C., and is turned on when its junction temperature falls below 120° C.

FIG. 12 shows still another control section according to the invention. This control section is, so to speak, a combination of the control section shown in FIG. 10 and unit 400 for protecting the semiconductor device against an excessively large current. Unit 400 comprises vertical type power MOS transistor 74.

Transistor 74 is formed in the region where power MOS transistor 22 is formed. Its source electrode occupies a tiny portion of this region, i.e., 1/100 to 1/3000 of the region, and is electrically separated from transistor 22. Transistor 74 is driven by the same gate voltage as is applied to power MOS transistor 22, and it outputs a small current proportional to the output current of power MOS transistor 22. MOS transistor 75 is formed in the same substrate as other lateral MOS transistors 26 and 70.

When external load $R_L$ is short-circuited, an excessively large current flows through power MOS transistor 22. Then, an excessively large current also flows into MOS transistor 74 which functions as a current-detecting element, thereby raising the gate potential of MOS transistor 75. When this gate potential reaches a threshold voltage of MOS transistor 75, a current will flow into transistor 75. As a result, the gate voltage of power MOS transistor 22 falls, and the output current of transistor 22 increases.

Unit 400 has a stabilization point which is determined by circuit constants, such as the area ratio of power MOS transistor 22 to MOS transistor 74, the resistance of resistor 276, the threshold voltage of MOS transistor 75, and the ratio of the on-resistance of transistor 74 to the resistance of resistor 276. Hence, a maximum current is determined in accordance with this stabilization point.

Without unit 400, the current ability of power MOS transistor 22 would indefinitely increases as the drain voltage increases. As long as the drain voltage is below a specific value (e.g., 2 volts), the current ability of transistor 22 increases in the same way as it would if unit 400 were not provided. However, once the drain voltage rises above this specific value, the drain current of MOS transistor 22 remains at a substantially constant value.

Hence, even if the external load, for example, is short-circuited, the load current is limited to a specific value. The semiconductor elements and wiring of the semiconductor device thereby can be reliably protected from an excessively large current.

What is claimed is:

1. A semiconductor device comprising:
    a semiconductor body;
    heat generating means, including an active semiconductor element;
    an insulation film formed on a surface of said semiconductor body;
    a heat-sensitive element including at least one diode element formed by a PN junction being formed in a polycrystalline silicon semiconductor layer on said insulation film in such a manner that said heat-sensitive element is separated from said semiconductor body, said heat-sensitive element detecting the temperature of said semiconductor body varying due to the heat generated by said heat generating means; and
    means, electrically connected to said heat-sensitive element, for deriving, as a temperature detection signal, the level of a forward voltage drop generated in said at least one diode element.

2. A semiconductor device according to claim 1, wherein said diode element having said PN junction includes a pair of highly doped region and lowly doped region, the impurity concentration of said lowly doped region being $1 \times 10^{19} cm^{-3}$ or more.

3. A semiconductor device according to claim 1, wherein said heat generating means is an active semiconductor element formed in said semiconductor body.

4. A semiconductor device according to claim 3, wherein said active semiconductor element is a vertical type power MOS transistor element.

5. A semiconductor device according to claim 1, wherein said diode element having said PN junction includes a pair of highly doped region and lowly doped region, the impurity concentration of said lowly doped region being $1 \times 10^{19}$cm$^{-3}$ or more; and said heat generating means is an active semiconductor element formed in said semiconductor body, said active semiconductor element being a vertical type power MOS transistor.

6. A semiconductor device according to claim 3, wherein said heat-sensitive element has a plurality of PN junctions including each of a pair of highly doped regions and lowly doped regions, and further includes a conductive member which connects said plurality of PN junctions to each other in series in the same polar direction so as to form a plurality of diode elements, the impurity concentration of said lowly doped region being $1 \times 10^{19}$cm$^{-3}$ or more; and the temperature of said semiconductor body generated by said active semiconductor element is detected by said plurality of diodes.

7. A semiconductor device according to claim 1, wherein said heat-sensitive element is located in the substantially center part of said semiconductor body, said heat generating means surrounding said heat-sensitive element region.

* * * * *